United States Patent [19]

Chantepie

[11] Patent Number: 5,077,687
[45] Date of Patent: Dec. 31, 1991

[54] GALLIUM ARSENIDE ADDRESSABLE MEMORY CELL

[75] Inventor: Bernard Chantepie, Chevry, France

[73] Assignee: U.S. Philips Corp., New York, N.Y.

[21] Appl. No.: 610,719

[22] Filed: Nov. 7, 1990

Related U.S. Application Data

[63] Continuation of Ser. No. 323,472, Mar. 14, 1989, abandoned.

[30] Foreign Application Priority Data

Mar. 18, 1988 [FR] France ................. 88 03540

[51] Int. Cl.⁵ .......................................... G11C 11/34
[52] U.S. Cl. .................................... 365/174; 365/154; 365/182
[58] Field of Search ............... 365/154, 174, 78, 182; 307/272.1, 272.2; 377/72, 79, 115, 117

[56] References Cited

U.S. PATENT DOCUMENTS

| | | | |
|---|---|---|---|
| 4,469,962 | 9/1984 | Snyder | 377/79 X |
| 4,638,183 | 1/1987 | Rickard et al. | 307/272.1 |
| 4,707,808 | 11/1987 | Heimbigner | 365/154 X |
| 4,777,623 | 10/1988 | Shimazu et al. | 365/154 |

OTHER PUBLICATIONS

E. Gonauser et al., "A Master Slice Design Concept Based on Master Cells in ESFI-SOS-CMOS Technology", Siemens Forschungs-und Entwicklungsberichte, vol. 5, No. 6, pp. 344-349, 1976.

Primary Examiner—Joseph A. Popek
Attorney, Agent, or Firm—Steven R. Biren

[57] ABSTRACT

An addressable memory cell (10) which is composed of an interrupt transistor (20) of the field-effect type whose source (S) is connected to the input terminal (I) of the cell (10) and whose gate (G) is connected to a clock (H, $\overline{H}$) and a loop (30) which includes a first inverter (31) which is connected in series with the drain (D) of the interrupt transistor (20) and whose output is connected to the output terminal (0) of the cell (10), and a second inverter (32) which is connected in series, in the loop (30), with the first inverter (31). In accordance with the invention; the cell (10) is made of gallium arsenide and the loop (30) also includes a diode (33) which is connected in the forward direction between the output of the first inverter (31) and the input of the second inverter (32), and a resistance (34) which is connected between the output of the second inverter (32) and the input of the first inverter (31).

2 Claims, 2 Drawing Sheets

GALLIUM ARSENIDE ADDRESSABLE MEMORY CELL

This is a continuation of application Ser. No. 323,472, filed Mar. 14, 1989, now abandoned.

BACKGROUND OF THE INVENTION

The invention relates to an addressable memory cell which is composed essentially of a field-effect interrupt transistor and a loop, referred to as a refresh loop, which notably includes two seriesconnected inverters. It also relates to a shift register and a memory having such addressable memory cells.

The invention can be particularly attractively used in the field of large scale integrated circuits (LSI).

An addressable memory cell of the general kind set forth above is known; the known cell is realized in MOS (Metal-Oxide Semiconductor) technology. The known cell consists of on the one hand a MOSFET interrupt transistor whose source is connected to the input terminal of said cell and whose gate is connected to a clock, and on the other hand of a loop which comprises a first inverter which is connected in series with the drain of said interrupt transistor, a second inverter which is connected in series, along the loop, with said first inverter and a second MOSFET transistor which is disposed between the output of the second inverter and the input of the first inverter, and whose gate is connected to a clock which is complementary to that whereto the gate of said MOSFET interrupt transistor is connected. The known addressable memory cell thus comprises two field-effect transistors and requires two clocks.

The general technical problem to be solved in realizing large scale integrated circuits (LSI) is to reduce the number of components of the assemblies performing a given function, for example addressable memory cells as well as shift registers and memories comprising such memory cells. Reduction of the consumption of the circuits is always another problem to solve. Finally, such solutions should preferably be achieved without affecting the performance and the dynamics in particular.

Thus, the technical problem to be solved is to propose an addressable memory cell which consists of on the one hand a field-effect interrupt transistor whose source is connected to the input terminal of said cell and whose gate is connected to a clock, and on the other hand a loop which comprises a first inverter which is connected in series with the drain of said interrupt transistor and whose output is connected to the output terminal of the cell, and a second inverter which is connected in series, along the loop, with said first inverter, which cell should be formed by a smaller number of transistors and have a lower current consumption while the operating frequency should still be high, thus offering substantial savings as regards components and energy when large numbers of memory cells are assembled in shift registers or memories.

SUMMARY OF THE INVENTION

In accordance with the invention, the technical problem is solved in that said cell is made of gallium arsenide, the loop also comprising a diode which is connected in the forward direction between the output of the first inverter and the input of the second inverter, a resistance being disposed between the output of the second inverter and the input of the first inverter.

Thus, it appears that in comparison with the known memory cell the interrupt transistor in the loop has been omitted, reducing the number of transistors in each cell to 1. On the other hand, the reduction of the number of transistors and the use of gallium arsenide result in to a substantial reduction of the consumption. Finally, the loop (also referred to as refresh loop) still being present, no limitation whatsoever is imposed as regards the of operation frequency. As will be described in detail hereinafter, the technical effect obtained by the cell in accordance with the invention essentially consists in that the presence of a diode in the loop enables the output voltage of the cell to be raised by compensation of the reduction of the level which is introduced by the MESFET transistor of the first inverter which, in GaAs technology, comprises an intrinsic diode in which the intrinsic capacitance Cgs, fixing the input level of the cell, is partly discharged.

The addressable memory cell in accordance with the invention also offers other advantages. It notably operates so that it is insusceptible to variations in the relevant technology-dependent parameters due to fluctuations of the manufacturing process, because the loop introduces a comparatively large feedback. It will also be seen that the diode of the loop participates in a capacitive circuit capable of absorbing the transient signals emitted by the clocks.

Finally, the output level of the cells being maintained, the cells can be grouped. Thus, a shift register comprising N seriesconnected addressable memory cells in accordance with the invention can be realized, so that the clock signals applied to the interrupt transistors are alternately H and $\overline{H}$ so as to form master-slave cell pairs. Similarly, a memory can be formed which comprises M shift registers in accordance with the invention whose addressable memory cells are connected to a bus via an address interrupt transistor. In that case, notably in order to increase the speed of the memory, the output of the diode and the output of the second inverter of the loop of each addressable memory cell are connected to a respective gate of two field-effect transistors which are connected in series in order to form a push-pull stage, the junction node of said transistors is connected to the source of the address interrupt transistor. This arrangement also offers the advantage that the push-pull stage absorbs the transient signals due to the address transistor.

JP Kokai 61-269412 discloses a memory cell comprising an input terminal coupled to a feedback-arrangement via a clocked MOS transistor. The feedback-arrangement comprises a cascade of two inverters, the output of the second inverter being coupled to the input of the first inverter via a resistance having a high resistance value. The inverters have mutually different thresholds in order to execute a proper operation. Since the problems referred to above and hereinbelow do not occur in MOS circuits, that is to say a decrease of voltage levels because of non-negligibly small input currents of MESFET transistors, no hint is given as regards inserting a diode and connecting the output terminal between the output of the first inverter and the input of the second inverter.

BRIEF DESCRIPTION OF THE DRAWING

The features of the invention and how it can be carried out will be better understood on the basis of the following description which is given, by way of example, with reference to the attached drawings in which:.

DESCRIPTION OF THE PREFERRED EMBODIMENTS

Figure 1:
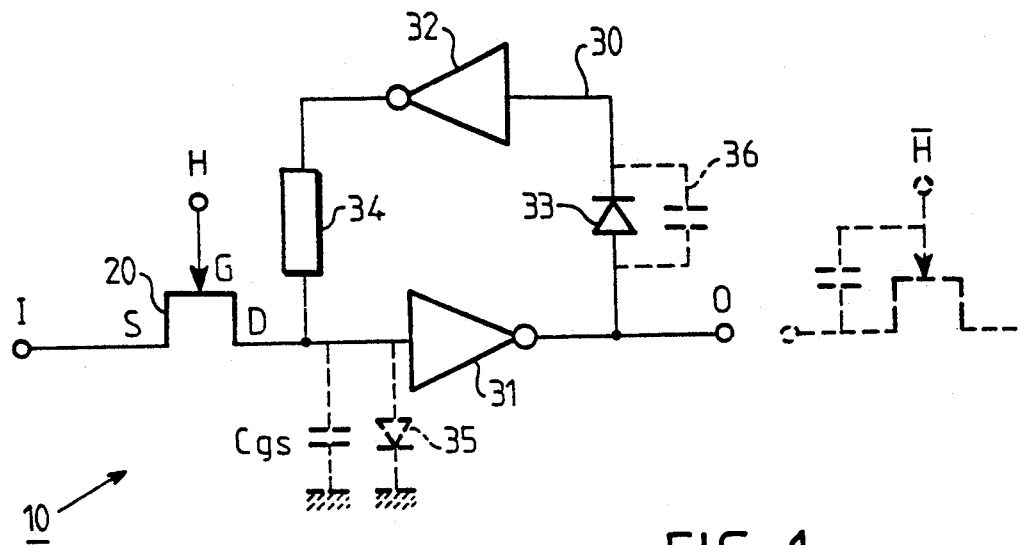
FIG. 1 shows the diagram of an addressable memory cell in accordance with the invention.

The diagram of FIG. 1 shows an addressable memory cell 10 which is composed of on the one hand a MESFET interrupt transistor 20 made of gallium arsenide. The source S of the transistor 20 is connected to the input terminal I of the cell 10, the gate G being connected to a clock H. On the other hand, the cell 10 is also formed by a loop 30 which is realized on a GaAs substrate and which comprises a first inverter 31 which is connected in series with the source drain path of the interrupt transistor 20 and whose output is connected to the output terminal 0 of the cell 10, and a second inverter 32 which is connected in series, along the loop 30, with said first inverter 31. As appears from FIG. 1, the loop 30 also comprises a diode 33 which is connected in the forward direction between the output of the first inverter 31 and the input of the second inverter 32, and a resistance 34 which is disposed between the output of the second inverter 32 and the input of the first inverter 31.

When the level of the clock H is 1 and the input I is 1, the intrinsic capacitance Cgs of the MESFET transistor of the first inverter 31 is charged to a value which is limited to approximately 0.7 V by the intrinsic diode 35 present at the input of all MESFET transistors realized on gallium arsenide. It appears from FIG. 1 that in the absence of the loop 30 the changing to zero of the clock level would cause a partial discharge of Cgs in the diode 35. The input level at D would then be in the order of 0.4 V, which is insufficient, taking into account noise, for discrimination between a logic level 0 and a logic level 1. However, the loop 30 as shown in FIG. 1 enables the input voltage at the point 0 to be maintained at 0.7 V. Actually, the presence of the feedback loop enables, when suitably dimensioned, the supply of the necessary direct current to the diode 35 for maintaining the voltage at 0.7 V. However, it is to be noted in FIG. 1 that the diode 33 has a parallel-connected intrinsic capacitance 36 which is coupled to the gate-source capacitance of the interrupt transistor of the next cell, (denoted by dashed lines). The capacitive circuit thus formed enables absorption of the transient signals emitted when the level of the clock H changes, thus protecting the first inverter 31.

It is to be noted that the resistance 34 may have a resistance value equal to zero, i.e. a short-circuit. However, the presence of a resistance having a non-negligibly small resistance value may limit the current at switching over.

Figure 2:
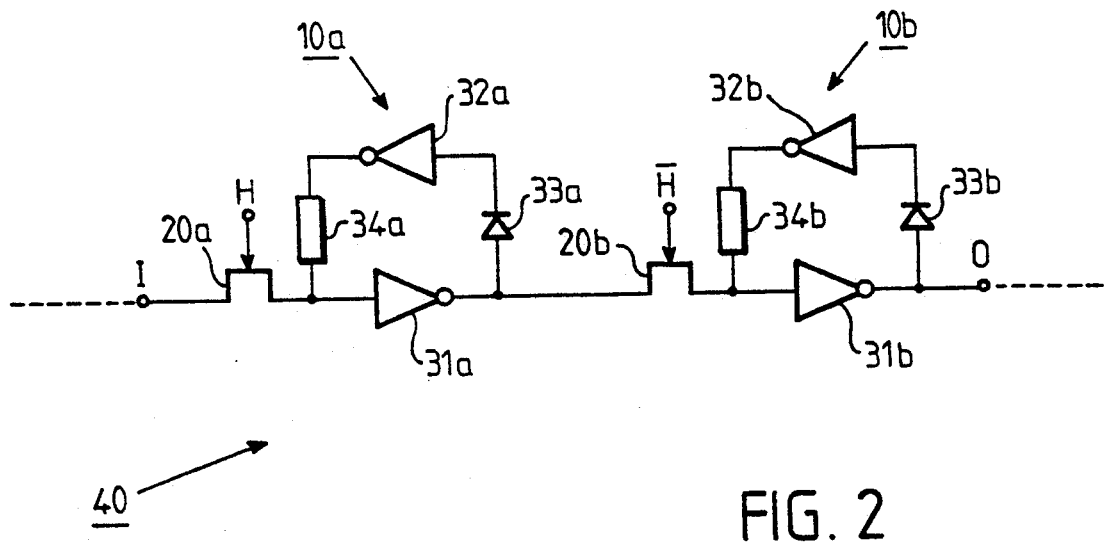
FIG. 2 shows the diagram of a master-slave cell of a shift register in accordance with the invention.

FIG. 2 shows a shift register 40 which comprises N addressable memory cells 10a, 10b of the type shown in FIG. 1. The clock signals applied to the transistors are alternately H and $\overline{H}$, the cell receiving clock signal H being the master cell 10a and the cell receiving clock signal $\overline{H}$ being the slave cell 10b.

Figure 3:
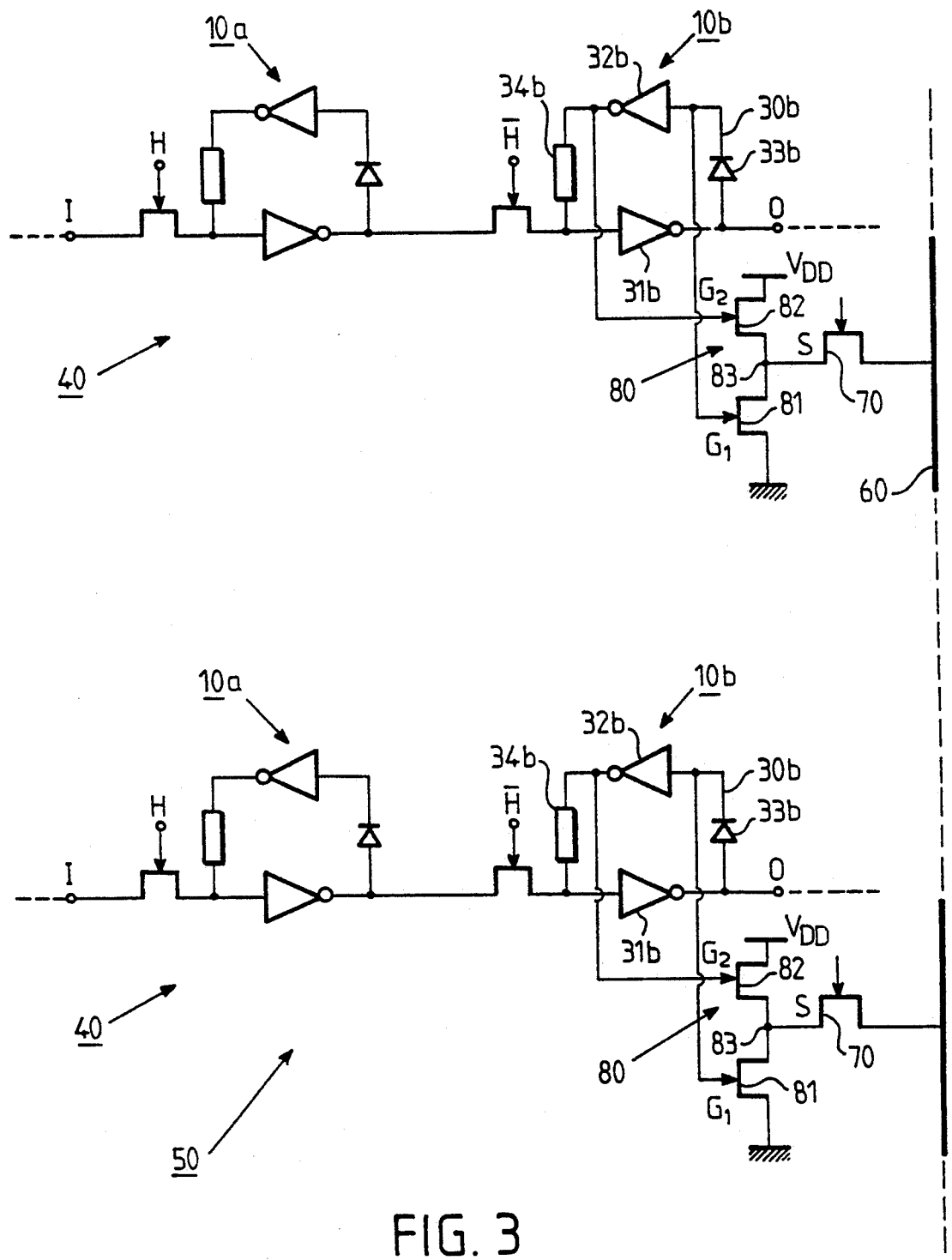
FIG. 3 shows the diagram of an addressable memory in accordance with the invention.

The diagram shown in FIG. 3 represents a register 50 comprising M shift registers 40 which are analogous to that shown in FIG. 2, its slave cells 10b being connected to a bus 60 via an address interrupt transistor 70. It would be possible to connect the transistor 70 directly to the output 0 of the cell 10b. However, this arrangement would have the drawback that the speed of the memory would be limited to the charging speed of the gate-source capacitance of the address transistor. On the other hand, the presence of this transistor would cause other transient signals which would be added to those produced by the clocks.

Moreover, as appears from FIG. 3, the output of the diode 33b and the output of the second inverter 32b of the loop 30b of each slave cell 10b are connected to the gate G1 and the gate G2, respectively, of two series-connected field-effect transistors 81, 82 which form a push-pull stage 80 whose center point 83 is connected to the source of the address interrupt transistor 70.

In operation, the lower output impedance of the push-pull stage enables the transient switching signals to be absorbed more rapidly.

The circuit shown in FIG. 3 thus makes it possible to prevent the charge of the capacitance of the transistor 70 from occurring on the output 0 so that this point is not slowed. Moreover, the transient signals due to the address transistor 70 are isolated by the push-pull stage 80 and do not disturb the operation of the shift register 40.

This disposition also enables connection of N identical cells to a single output bus as in the case of a conventional static memory, the interrupt transistor 70 presenting a high impedance when it is pinched.

I claim:

1. A memory cell, comprising an input terminal and an output terminal, an interrupt field-effect transistor having a control electrode for receiving a control signal and a current channel, a first end of said channel being connected to said input terminal, a first inverter having an input coupled to a second end of said channel and an output coupled to said output terminal, a diode, a second inverter having an input coupled to the output of said first inverter by said diode and an output continuously coupled to the input of said first inverter, said diode being connected in the forward direction between the output of said first inverter and the input of said second inverter and said memory cell being fabricated in GaAs technology.

2. A memory cell as claimed in claim 1, characterized in that a resistance is disposed between the output of the second inverter and the input of the first inverter.

* * * * *